United States Patent
Meusburger et al.

(10) Patent No.: US 6,937,098 B2
(45) Date of Patent: Aug. 30, 2005

(54) TRANSLINEAR AMPLIFIER

(75) Inventors: Walter Meusburger, Graz (AT); Andreas Sibrai, Kroffendorf (AT); Josef Niederl, Graz (AT)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 81 days.

(21) Appl. No.: 10/676,919

(22) Filed: Oct. 1, 2003

(65) Prior Publication Data

US 2005/0052234 A1 Mar. 10, 2005

(30) Foreign Application Priority Data

Sep. 9, 2003 (EP) ............................................. 03368088

(51) Int. Cl.⁷ ................................................ H03F 3/45
(52) U.S. Cl. ...................................... 330/253; 330/301
(58) Field of Search .............................. 330/253, 254, 330/259, 260, 301, 69, 150, 310

(56) References Cited

U.S. PATENT DOCUMENTS

| | | | |
|---|---|---|---|
| 4,728,900 A | 3/1988 | Nakagawara et al. ....... 330/253 |
| 5,432,474 A | 7/1995 | Lauffenburger et al. .... 330/252 |
| 6,011,436 A | 1/2000 | Koike ......................... 330/253 |
| 6,028,478 A | * 2/2000 | Seremeta et al. ........... 330/252 |
| 6,121,824 A | 9/2000 | Opris .......................... 327/539 |
| 6,396,311 B2 | * 5/2002 | Inn .............................. 327/70 |
| 6,456,142 B1 | * 9/2002 | Gilbert ....................... 327/356 |
| 6,563,375 B1 | * 5/2003 | Khosrowbeygi et al. .... 327/563 |
| 6,798,290 B2 | * 9/2004 | Groe et al. ................. 330/254 |

* cited by examiner

*Primary Examiner*—Patricia Nguyen
(74) *Attorney, Agent, or Firm*—George O. Saile; Stephen B. Ackerman

(57) ABSTRACT

In a translinear amplifier, where the output voltage difference is kept at the same relative difference as the input voltage difference and which is normally formed by two current balancing circuits and some form of an amplifier stage, said amplifier stage is drastically simplified and even replaced by a simple diode. Two additional functions sharply limit the analog operating region: an added current limiting transistor on one side and the purpose use of the voltage limited by the power supply on the other side. One key objective is linearly switching on or off a transistor, and getting sharp maxima and minima of its RDSon at the extreme ends.

33 Claims, 11 Drawing Sheets

TRANSLINEAR AMPLIFIER

RELATED PATENT APPLICATION

This application is related to U.S. patent application Ser. Nos. 10/764,920 and 10/764,914 both filed on Jan. 26, 2004 and assigned to the same assignee as the present invention.

BACKGROUND OF THE INVENTION

(1) Field of the Invention

The invention relates to integrated MOSFET semiconductor circuits, and more in particular to a translinear amplifier. According to the objectives of the invention said translinear amplifier is intended lo work linearly within a wide specified region and to achieve sharp cutoff edges at the limits of said linear operating region, to force e.g. a switching transistor, which said translinear amplifier may be intended to drive, into minimum RDSon or maximum RDSoff. A possible, but not exclusive, use is to control a chain of switching transistors for a voltage controlled capacitor, formed by a larger number of small capacitors.

(2) Description of the Prior Art

In a translinear amplifier, the output voltage difference is kept at the same relative difference as the input voltage difference, independent of the absolute output voltage level. Said translinear amplifier is normally formed by two current balancing circuits and some form of an amplifier stage, where the amplifier forces the output voltage difference to be exactly the input voltage difference.

FIG. 1 (Prior Art) shows the block presentation of a translinear amplifier and FIG. 2 (Prior Art) shows the principal components diagram of a translinear amplifier.

In FIG. 2 (Prior Art) a first current dividing circuit with two branches, N1 and N2, and with a common current source I1, is connected to said translinear amplifier's inputs Vin-p and Vin-n. A second current dividing circuit with two branches, N5 and N6, and with a common current source I2 is connected with said translinear amplifier's reference voltage Vr f and with said translinear amplifiers output Vout. In both current-dividing circuits, a current probing circuit (N4 and N8) determines the current in one of its branches, which is a measure of the current ratio within each said current dividing circuit. An amplifier AMP compares both current probing signals and, in a closed feedback loop, forces the output voltage Vout to change until both values measured at said current probes are the same. The amplifier AMP generates Vout-p such that I2p=I1p, which is only true if Vin-p−Vin-n=Vout-p−Vout-n. The absolute voltage level of Vout p and Vout n is independent of the level of Vin-p and Vin-n. As can be seen, the translinear amplifier works as a perfect level shifter with a gain of 1. The translinear amplifier operates linear in a wide voltage range, however the characteristic is more or less undefined outside this normal operating range, causing soft cutoff edges at the limits of said linear operating region.

U.S. Pat. No. 6,121,824 (to Opris) describes a translinear circuit with series resistance compensation, where a sub circuit including three bipolar transistors is substituted in place of a single bipolar transistor to achieve extrinsic base and emitter series resistance compensation in translinear circuits.

U.S. Pat. No. 5,432,474 (to Lauffenburger and Moore) discloses a fixed and adjustable bandwidth translinear input amplifier. An improved method and circuitry for processing high-impedance (current mode) input signals for use in translinear and other mode circuits in a manner that avoids the signal dependent bandwidth variations that occur in the prior art. A non-linear feedback structure using a transconductance gain element is employed to extend the bandwidth and/or suppress bandwidth variations.

SUMMARY OF THE INVENTION

In accordance with the objectives of this invention, in a first aspect, a simplified translinear amplifier, working linear within a wide specified region, is achieved and, in a second aspect, added functions to achieve sharp cutoff edges at the limits of said linear operating region. A possible, but not exclusive, application is a voltage controlled capacitor, formed by a larger number of small capacitors and controlled through a chain of switching transistors, where each transistor within said chain of switching transistors is driven by one translinear amplifier.

According to said first aspect, the amplifier portion within the circuit is implemented with the smallest possible circuit count and is finally degraded to just a diode connection.

The translinear amplifier, as used in this invention, uses a first current dividing circuit with two branches, with at least one MOSFET transistor in each branch, and with a common current source, where the gates of said MOSFET transistors are connected with the translinear amplifier's inputs and where the current ratio in said branches of said first current dividing circuit is dependent on said translinear amplifier's input voltage difference, and it uses a second current dividing circuit with two branches, with at least one MOSFET transistor in each branch, and with a common current source, where one gate of said MOSFET transistors is connected with said translinear amplifier's reference voltage and the other gate is connected to said translinear amplifier's output and where the current ratio in said branches of said second current dividing circuit is dependent on the voltage difference of said translinear amplifier's reference voltage and output voltage; and it implements a closed feedback loop to force the current division within said first current dividing circuit and the current division within said second current dividing circuit to the same value of current ratios.

According to the invention, a novel form of closed feedback loop within said translinear amplifier is implemented. Said closed feedback loop measures the current with a current probing device in one branch of said first current dividing circuit and feeds the measured value to a current controlling device placed in the equivalent position of one branch of said second current dividing circuit. As a consequence said second current dividing circuit is forced out of balance, which then forces, due to the closed feedback loop, said second current dividing circuit to react, until said input voltage difference and said difference of the voltages between said translinear amplifier's reference voltage and output voltage are the same.

According to the invention, a possible solution for device providing the required reaction is just one MOSFET transistor, used as a diode, i.e. with the source and the gate of said MOSFET transistor directly connected. That MOSFET transistor would replace the current probing device of the prior art solution. In addition part of the closed feedback loop is realized by means of a simple connection between the source and the gate of said MOSFET transistors connected to say translinear amplifiers output. As can be seen, the components normally required for an amplifier within the feedback loop are completely eliminated.

The translinar amplifier normally has a gain of 1. Said gain can also be different from 1; however for a gain different from 1, the translinear amplifier is only linear for small signals.

According to said second aspect, two additional circuit functions sharply limit the analog operating region through an extra current limiting transistor on one side and the purposely use of the voltage limited by the power supply on the other side. A possible application in mind is to linearly control said translinear amplifier's output, for example for switching on or off a transistor in an application where a wide linear range is desired, and getting sharp cutoff edges, for example for switching on or off a transistor in said application to achieve minimum RDSon and maximum of RDSoff at the extreme ends.

A second fundamental concept in accordance with the objectives of the invention for the translinear amplifier, to work linearly within a wide specified voltage range and then having sharp cutoff edges at the limits of said linear operating range is to add circuits to, first, define the linear operating range and then, second, to sharply raise said translinear amplifier's (negative) output voltage, outside the linear operating range, as well as to sharply limit said translinear amplifiers (positive) output voltage outside the linear operating range. A limiting transistor circuit builds the circuit to sharply drive the output to negative voltage, once the linear range is exceeded on one side. To get a sharp limit of the output voltage on the opposite side, the limiting function of the supply voltage is used as a purposely effect. No additional components are required to achieve the desired effect in this case.

An even further concept implemented in the proposed circuit is to switch off most of the circuit elements to reduce the power consumption when the translinear amplifier itself is outside said linear operating range.

In accordance with the objectives of this invention, in said first aspect, a simplified translinear amplifier, working linear within a wide specified region, is achieved and, in said second aspect, added functions to provide sharp cutoff edges at the limits of said linear operating region, are achieved.

According to the objectives of the invention, the following methods are applied. Whenever the differential input voltage changes, the current balance ratio in the first current balancing circuit changes accordingly. A current probing device within the current path of said first current balancing circuit generates a signal, representing the actual current in that path. A connection feeds said current probing signal to the gate of a current controlling device within the current path of said second current balancing circuit, which is placed at the same position as said current probing device in said first current balancing circuit. Said current controlling device, by means of said current controlling signal, forces said second current balancing circuit out of balance, which, as a direct consequence, forces said second current balancing circuit to react, until said second current balancing circuit reaches a new stable current ratio, which is now the same ratio as in said first current balancing circuit. Now the voltage difference between said translinear amplifier's output voltage Vout and the reference voltage Vref is the same as the differential input voltage between Vin-p and Vin-n of said translinear amplifier.

BRIEF DESCRIPTION OF THE DRAWINGS

In the accompanying drawings, forming a material part of this description, there is shown.

DESCRIPTION OF THE PREFERRED EMBODIMENTS

The objectives of this invention are to build an amplifier, which keeps the output voltage difference at the same relative difference as the input voltage difference to said amplifier within a wide and well-defined linear range. Further the objectives are to sharply limit the analog operating region and to change to a typical switching characteristic when the output signal leaves said defined linear range. A possible application in mind is linearly switching on or off a transistor, and getting sharp maxima and minima of its RDS at the extreme ends. That linear switching function could be used in a switching chain for a voltage controlled variable capacitor, made of a larger number of small capacitors. The proposed invention can provide the controlling mechanism for such voltage controlled variable capacitor with excellent linearity and high Q for the use in oscillators and variable filters.

In a first aspect, a simplified translinear amplifier, working linear within a wide specified region, is achieved and, in a second aspect, functions are added to achieve sharp cutoff edges at the limits of said linear operating region.

Figure 1:
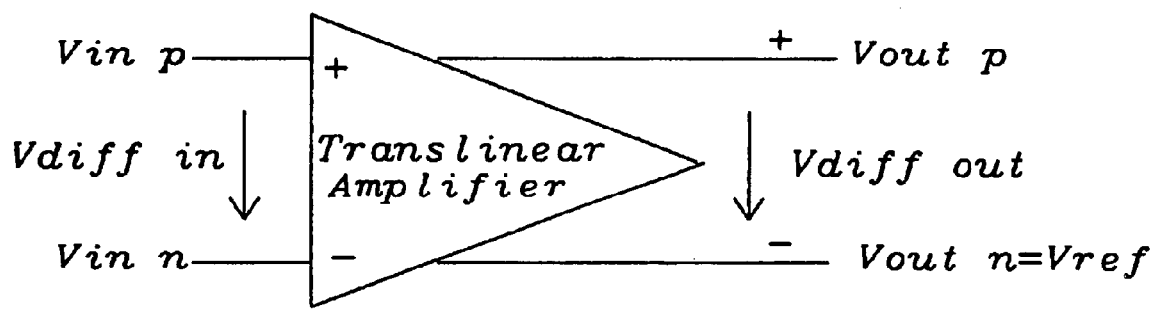
FIG. 1 (Prior Art) shows block presentation of a translinear amplifier.
Figure 2:
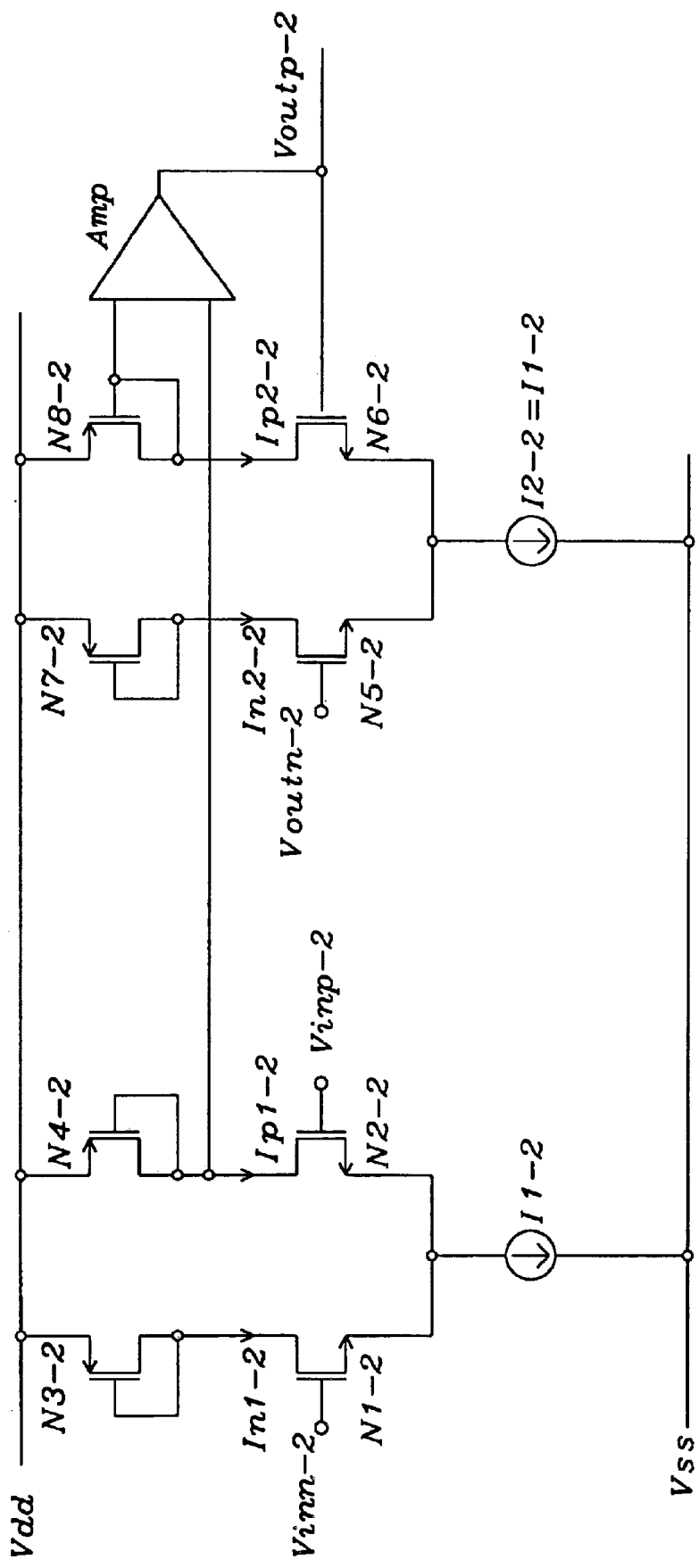
FIG. 2 (Prior Art) shows a principal components diagram of a possible solution of a translinear amplifier.

According to said first aspect, the amplifier stage AMP in FIG. 2 (Prior Art) is implemented with the smallest possible circuit count. Said amplifier stage AMP is finally degraded to just a diode connection, as is shown in FIG. 3.

In the circuit of FIG. 2 (Prior Art), a voltage difference Vdiff-in=Vin-p−Vin-n divides the current I1 into I1$p$ and I1$n$. The amplifier AMP in FIG. 2 takes the voltages at the gates of the current probing transistors N4 and N8 and changes the voltage at the gate of N6 until said voltages at said gates of transistors N4 and N8 are equal, i.e. said amplifier generates Vout-p such that I2$p$=I1$p$, which is only true if Vin-p−Vin-n=Vout-p−Vout-n.

Figure 3:
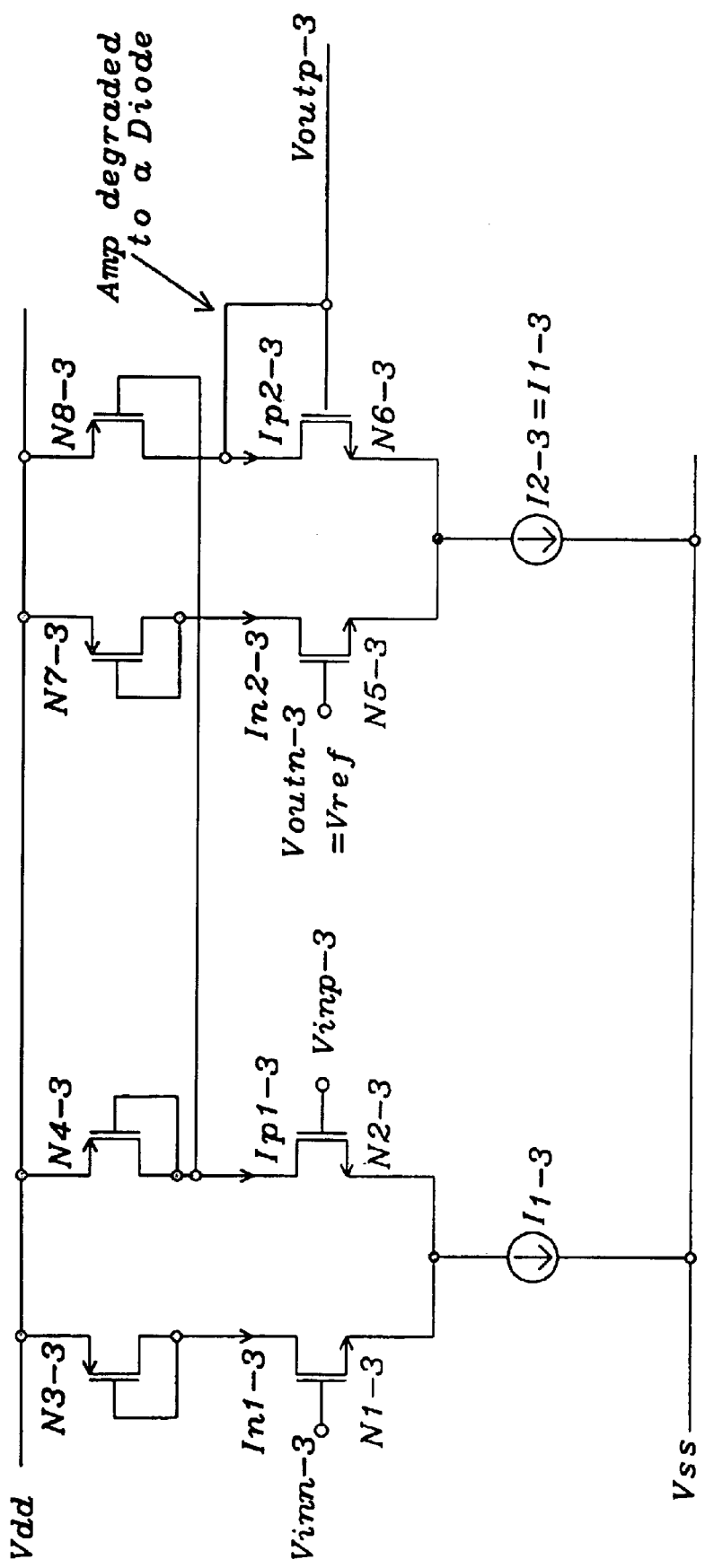
FIG. 3 shows a principal components diagram of a translinear amplifier with an amplifier stage with minimal component count.

The translinear amplifier, as used in this invention and shown in FIG. 3, uses a first current dividing circuit with two branches, built by MOSFET transistors N1-3 and N2-3, and with a common current source I1-3, and connecting to said translinear amplifier's inputs Vin-p-3 and Vin-n-3, And it uses a second current dividing circuit with two branches, built by MOSFET transistors N5-3 and N6-3, and with a common current source I2-3, connecting to said translinear amplifier's reference voltage Vref=Vout-n-3 and to said translinear amplifier's output Vout=Vout-p-3.

According to the invention, a novel form of closed feedback loop within said translinear amplifier is implemented to force the current division within said first current dividing circuit and the current division within said second current dividing circuit to the same value of current ratios. Said closed feedback loop measures the current with a current probing device N4-3 in one branch of said first current dividing circuit and feeds the measured value to a current controlling device N8-3 placed in the equivalent position of one branch of said second current dividing circuit. As a consequence, when the current in said fist current dividing circuit changes, said second current dividing circuit is forced out of balance by said current controlling device. Then it forces said second current dividing circuit to react until said input voltage difference Vdiff-in=Vin-p-3–Vin-n-3 and said difference of the voltages between said translinear amplifier's reference voltage and output voltage Vdiff-out=Vout-p-3–Vout-n-3 are the same. MOSFET transistor N6-3 plays a major role in that feedback loop: said transistor has its gate directly connected to the drain of N6-3 and therefore the gate voltage follows directly the voltage of the connected drains of N6-3 and N8-3. In the proposed solution, MOSFET transistor N6-3 can also be considered to work as a diode.

MOSFET transistor N8-3 would replace the current probing device N8-2 of the prior art solution. In addition part of the closed feedback loop is realized by means of a simple connection between the source and the gate of said MOSFET transistor N6-3 connected to said translinear amplifiers output. As can be seen, the normally required components of an amplifier AMP of prior art within the feedback loop are completely eliminated: the former amplifier AMP is now degraded to a simple diode connection.

Figure 4:
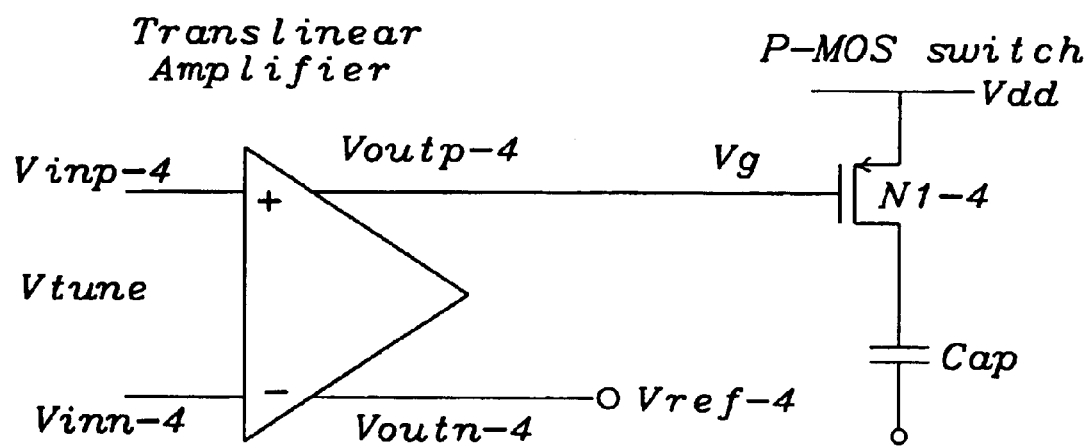
FIG. 4 demonstrates a translinear amplifier driving a P-MOS switcher in a varicap application.

The circuit operation operates as its best when the output load at Vout-p-3 is of high impedance, as it is the case in the proposed application for a capacitor switching chain for a voltage controlled variable capacitor with linear characteristic. One such stage of said capacitor switching chain is shown in FIG. 4.

The translinear amplifier normally has a gain of 1. Said gain can also be different from 1; however for a gain different from 1, the translinear amplifier is only linear for small signals.

$$\text{The gain of a translinear amplifier is } \sqrt{\frac{I2}{I1} * \frac{\frac{W2}{L2}}{\frac{W1}{L1}}}$$

According to said second aspect, two additional circuit functions sharply limit the analog operating region through an extra current limiting transistor on one side and the purposely use of the voltage limited by the power supply on the other side. Key objective is to linearly control said translinear amplifier's output, for example for switching on or off a transistor in an application like it is shown in FIG. 4, and getting sharp cutoff edges, for example for switching on or off a transistor in said application to achieve minimum RDSon and maximum of RDSoff at the extreme ends. The desired output characteristic is visualized in FIG. 5.

Figure 5:
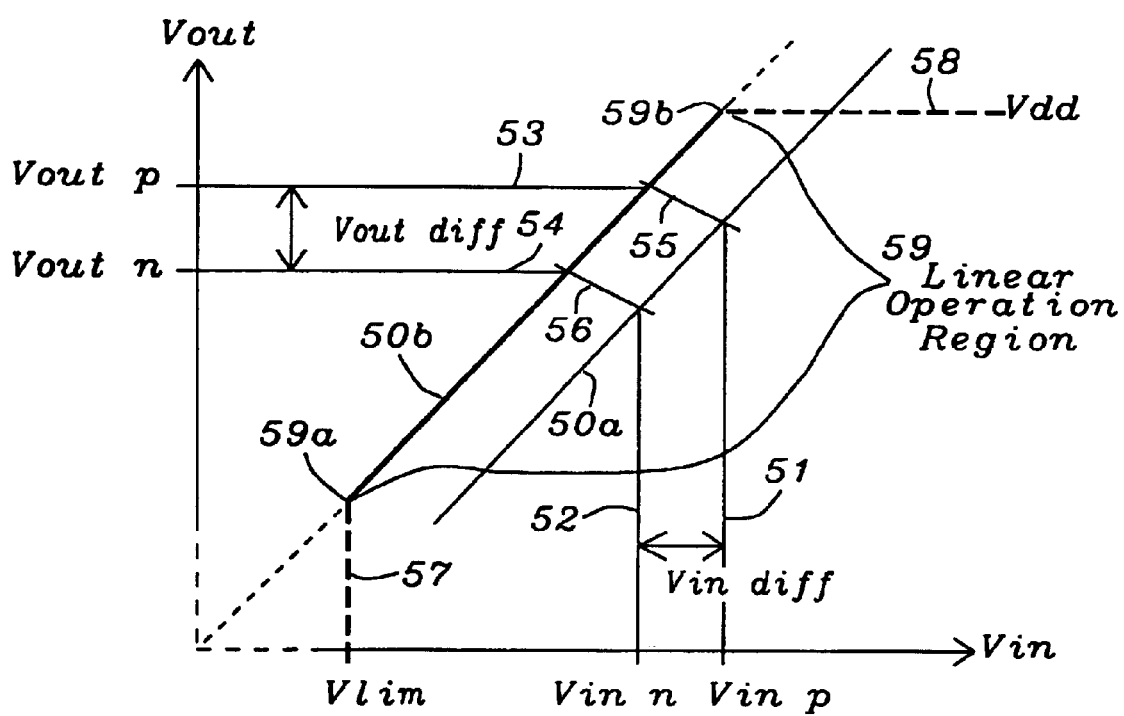
FIG. 5 visualizes the relationship of the input differential voltage and the output differential voltage of the translinear amplifier.

FIG. 5 visualizes the relation between the input voltages Vin-p/Vin-n and the output voltages Vout-p/Vout-n. The differential input voltage Vin-diff, represented by lines 51 and 52 is mirrored at lines 50a and 50b into the output differential voltage Vout-diff, represented by lines 53 and 54. The translinear operation of the translinear amplifier, is visualized with lines 55 and 56, where lines 51, 50a and 55 always cross at the same point and where also lines 52, 50a and 56 always cross at the same point; said lines 55 and 56 together, representing said translinear operation of said translinear amplifier, may have varying angles, but are forced to be always in parallel. Said lines 51 and 52, representing said differential input voltage Vin-diff, can slide together, with constant distance, up and down the input voltage scale, then their crossing points with lines 55 and 56 also slide along line 50a. Similar, said lines 53 and 54, representing said differential output voltage Vout-diff, can slide together up and down the output voltage scale and their crossing points with lines 55 and 56 then slide along line 50b.

When said input voltages, represented by lines 51 and 52, have a specific differential value, i.e. lines 51 and 52 have a specific distance, the mirroring mechanism of said translinear amplifier, represented by said lines 55 and 56, forces said lines 53 and 54 to be at that same distance, i.e. said output voltage, represented by lines 53 and 54, takes the identical differential value Vout-diff, as the differential input voltage Vin-diff. As soon as said differential input voltage Vin-diff changes, said differential output voltage Vout-diff is forced to change by the same amount, independent of their absolute position on the voltage scale.

The linear operating region on line 50b is marked as the area 59 in FIG. 5. Once either output Vout-p or Vout-n reaches the cut-off voltage Vlim or when it reaches the power supply line Vdd, the linear operation is sharply cut off.

Figure 6:
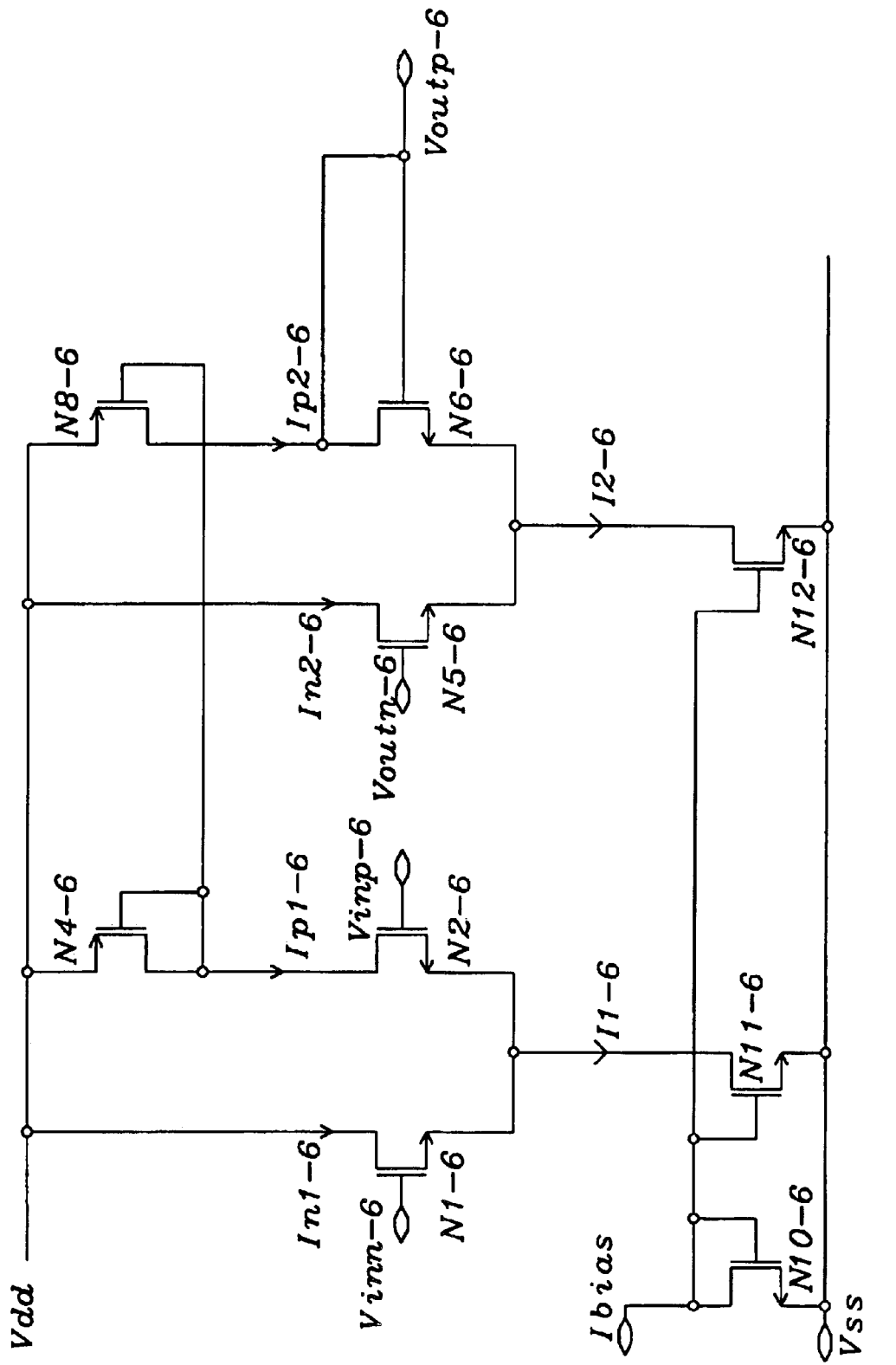
FIG. 6 shows a more detailed schematic of a possible final circuit solution.

A more detailed schematic of a possible final circuit solution is shown in FIG. 6. Equivalent to FIG. 3, a first current dividing circuit is built of two branches, with transistors N1-6 and N2-6, and a common current source I1-6 with transistor N11-6; said first current dividing circuit connects to said translinear amplifiers inputs Vin-p-6 and Vin-n-6. Further, a second current dividing circuit is built of two branches, with transistors N5-6 and N6-6, and a common current source I2-6 with transistor N12-6; said first current dividing circuit connects to said translinear amplifiers reference voltage Vout-n-6=Vref and to said translinear amplifier's output Vout-p-6=Vout. Transistor N10-6 produces a common voltage, controlled by Ibias to control said current sources I1-6 and I2-6.

According to the invention, said novel form of closed feedback loop within said translinear amplifier to force the current division within said first current dividing circuit and the current division within said second current dividing circuit to the same value of current ratios uses said current probing device (N4-6) within said first current dividing circuit and feeds the measured value to a current controlling device (N8-6) placed in the equivalent position within said second current dividing circuit. As demonstrated with FIG. 3, transistor N6-6 plays a major role in that feedback loop: said transistor has its gate directly connected to the drain of N6-6 and therefore the gate voltage follows directly the voltage of the connected drains of N6-6 and N8-6. As it was already demonstrated in FIG. 3, in the proposed solution, MOSFET transistor N6-6 operates as said amplifier AMP, degraded to a diode, The transistors equivalent to N3-3 and N7-3 in FIG. 3 are not implemented in said circuit of FIG. 6: they were implemented for perfect symmetry, but they are not necessary.

Figure 7:
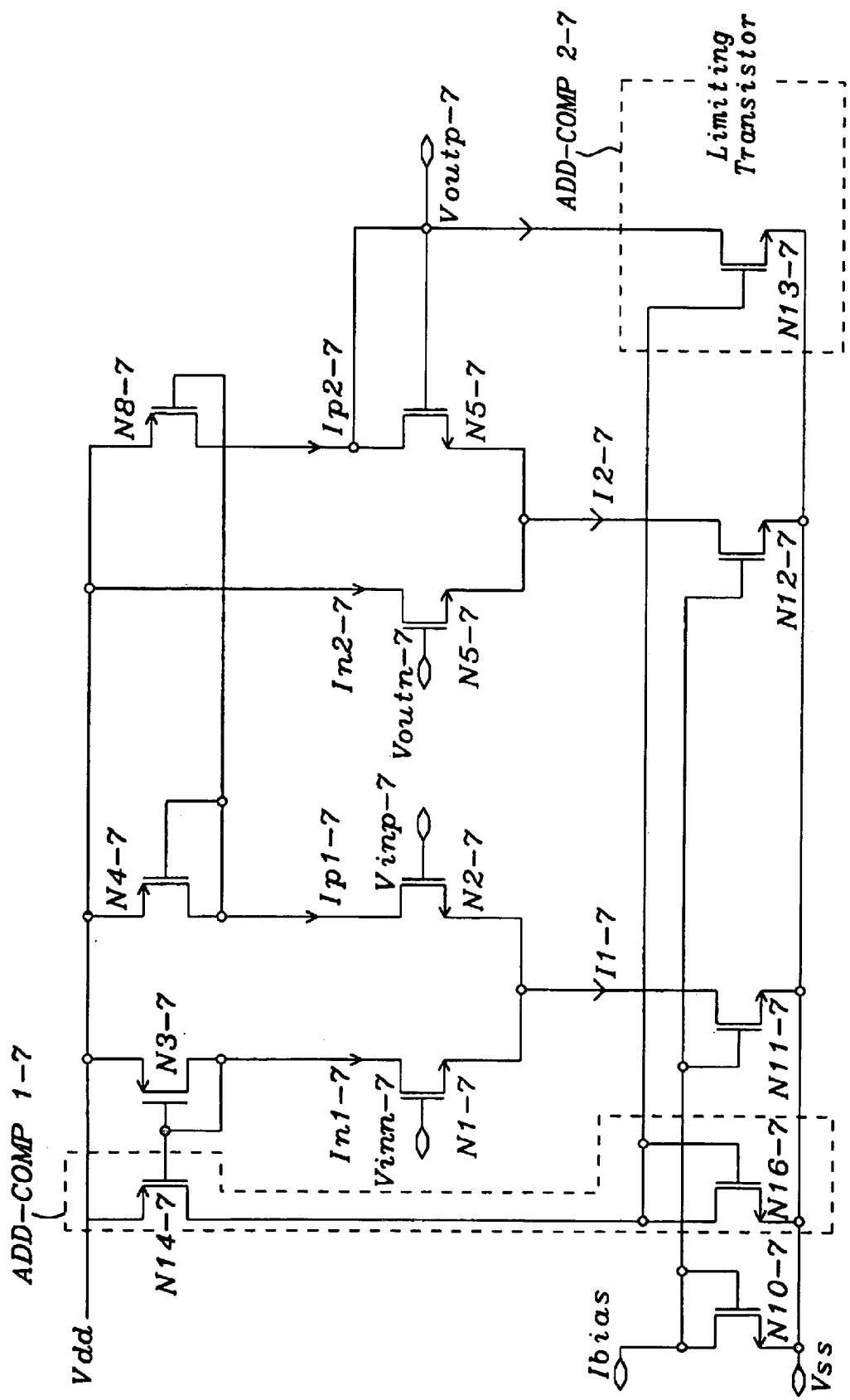
FIG. 7 shows the circuit with the additional limiting transistor function.

All transistors in said circuit of FIG. 6 are MOSFET transistor; all transistors could also be replaced together with their complementary equivalents:

FIG. 7 shows the circuit of FIG. 6 with the additional limiting transistor function, where the additional components are shown inside the dashed frames, marked with ADD-COMP 1-7 and ADD-COMP 2-7. According to said second aspect of this invention, two additional circuit functions sharply limit the analog operating region through an extra current limiting transistor on one side and the purposely use of the voltage limited by the power supply on the other side. Transistor N13-7 incorporates said current limiting transistor. Transistor N3-7 takes a current probe of said first current dividing circuit, built by transistors N1-7, N2-7 and N4-7 and mirrors it through N16-7 to said current limiting transistor N13-7. As soon as the current drawn by N13-7 exceeds the current provided by N8-7, N13-7 sinks all available current and the output is cut-off.

Similar, when the output voltage Voutp-7 swings Vdd, further voltage increase is suddenly impossible, this sharply limiting said linear operation region.

Figure 8:
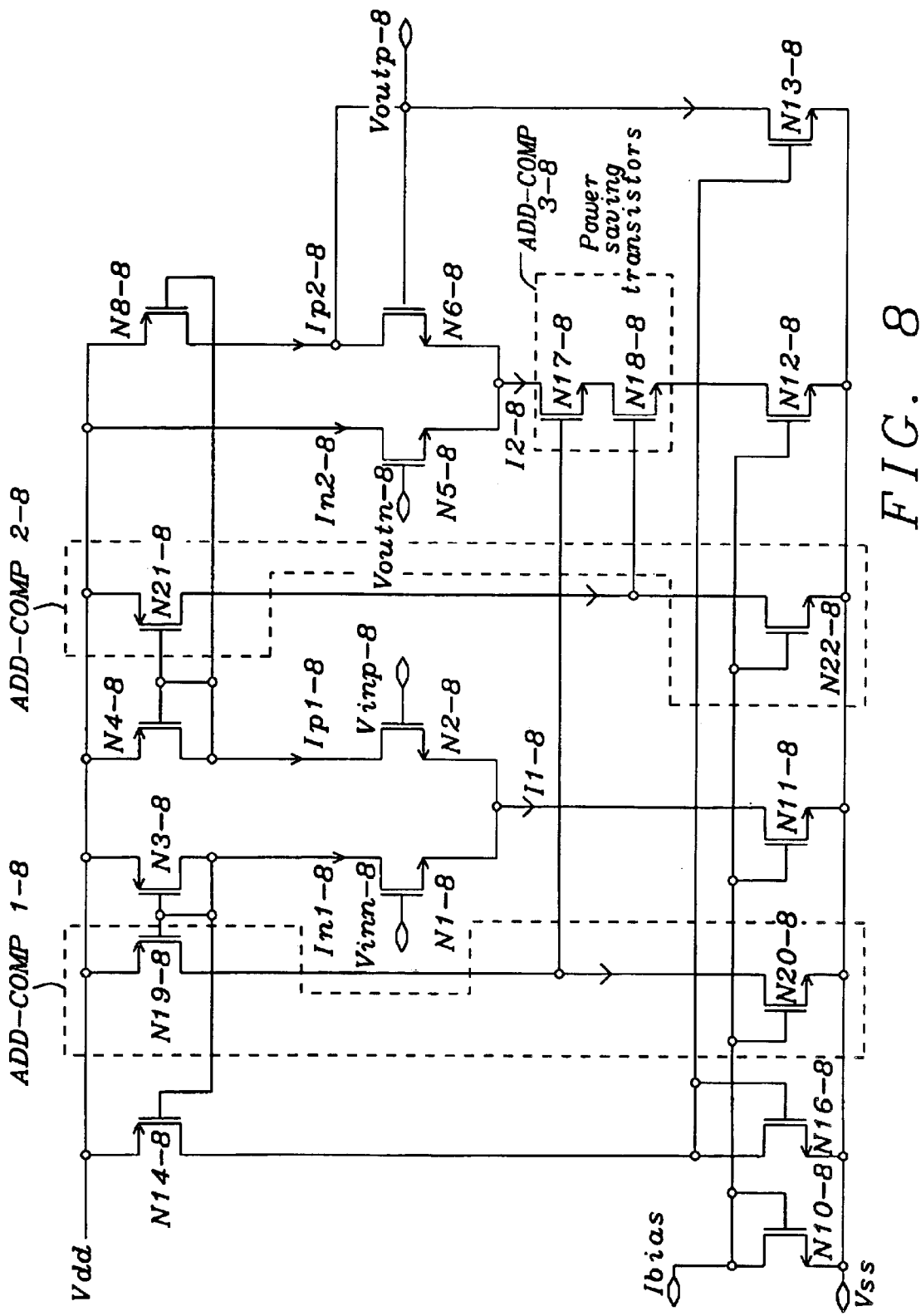
FIG. 8 shows the circuit with the additional power saving function.

FIG. 8 shows the circuit of FIG. 7 with the additional power saving function, where the additional components are shown inside the dashed frames, marked with ADD-COMP 1-8, ADD-COMP 2-8 and ADD-COMP 3-8. One concept implemented in the proposed circuit is to switch off most of the circuit elements to reduce the power consumption when the translinear amplifier itself is outside said linear operating range. Transistor N19-8 and N21-8 take a current probe on both branches of said first current dividing circuit, built by transistors N1-8, N2-8 and N4-and once the current in either branch becomes very low, said second current dividing circuit, built by transistors N5-8, N6-8 and N8-8 is switched off as well by means of transistors N17-8 and N18-8.

Figure 9:
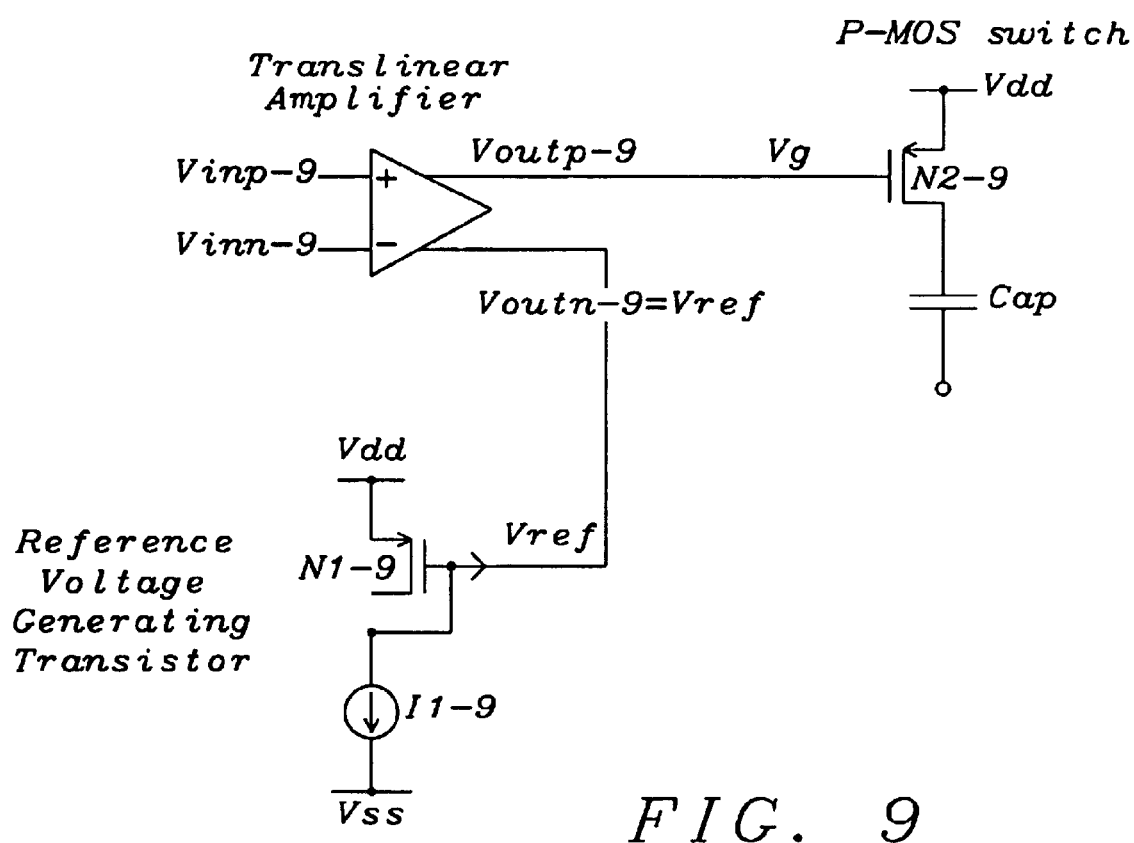
FIG. 9 shows a principal concept circuit for a reference voltage generation, compensation the temperature characteristics of the P-MOS switcher.

FIG. 9 shows the temperature compensating mechanism, implemented with the reference voltage generating circuit. Transistor N1-9 and current source I1-9 generate a reference voltage Vref, which then is connected to Voutn-9 of the translinear amplifier. Transistor N2-9 is a P-MOS switch and its input gate VG is attached to the output Voutp-9 of said translinear amplifier, for example to drive one switching stage within in a possible application of a voltage controlled capacitor, formed by a larger number of small capacitors CAP and controlled through a chain of switching transistors. Transistor N1-9 is of the same P-MOS type as the P-MOS switch N2-9 and therefore has the same temperature characteristics as P-MOS switch N2-9. The proposed arrangement of P-MOS transistor N1-9 compensates the temperature error of P-MOS switch N2-9.

Similar, when the transistor N2-9 is a N-MOS type transistor, a N-MOS type could also be used a within the reference voltage circuit.

A first fundamental concept of the disclosed invention is to add the methods and mechanism to achieve, in a first aspect, a simplified translinear amplifier, working linear within a wide specified region, and, in a second aspect, add functions to achieve sharp cutoff edges at the limits of said linear operating region, see FIG. 3. A first current dividing circuit with two branches, with N1-3 and N2-3, and with a common current source, I1-3 connects to said translinear amplifier's inputs Vinp-3 and Vinn-3. The current ratio in said branches of said first current dividing circuit directly depends on said translinear amplifiers input voltage difference; A second current dividing circuit with two branches, with N5-3 and N6-3, and with a common current source I2-3 connects with said translinear amplifier's reference voltage Vref=Voutn-3 and with said translinear amplifier's output Vout=Voutp-3. Similar, the current ratio in said branches of said second current dividing circuit directly depends on said translinear amplifier's voltage difference between said reference voltage and said output voltage. A closed feedback loop forces the current division within said first current dividing circuit and the current division within said second current dividing circuit to the same value of current ratios. Said closed feedback loop is primarily built of transistors N4-3 and N8-3 and of the direct connection between drain and gate of transistor N6-3.

A second fundamental concept in accordance with the objectives of the invention for the translinear amplifier, working linearly within a wide specified voltage range and having sharp cutoff edges at the limits of said linear operating range is to add circuit elements to define the linear operating range. Outside the linear operating range the circuit according to this invention will sharply raise said translinear amplifier's (negative) output voltage, or will sharply limit said translinear amplifier's (positive) output voltage. Transistors N13-7, N3-7, N14-7 and N16-7 in the circuit of FIG. 8 build the circuit to sharply drive the ouput to negative voltage, once the linear range is exceeded. To get a sharp limit of the output voltage, the limiting function of the supply voltage is used as a purposely effect. No additional components are required to achieve the desired effect.

In accordance with the objectives of this invention, in a first aspect, a simplified translinear amplifier, working linear within a wide specified region, is achieved and, in a second aspect, added functions to provide sharp cutoff edges at the limits of said linear operating region, is achieved.

Figure 10:
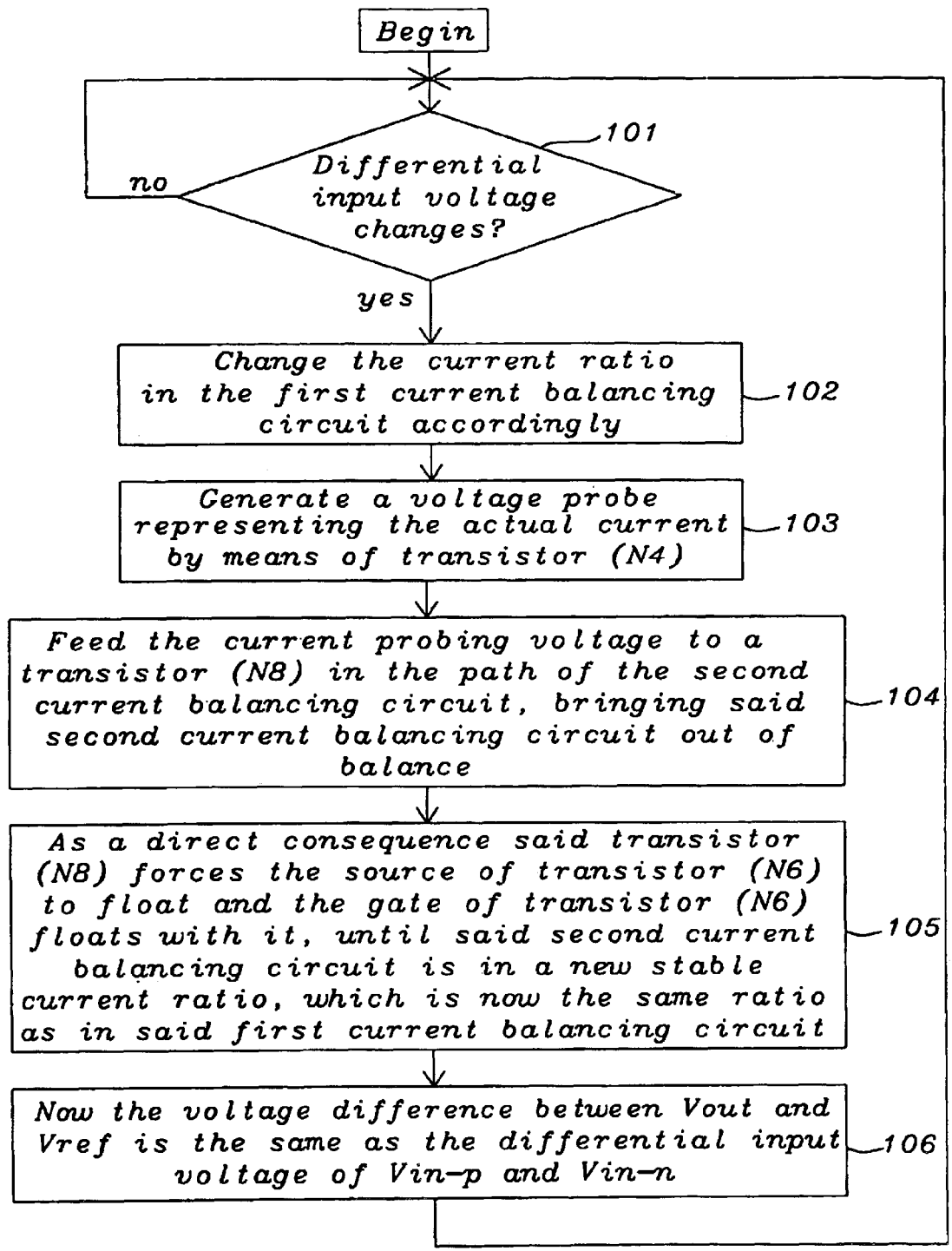
FIG. 10 briefly demonstrates the methods applied within the translinear amplifier.

The first method to achieve the objectives of this invention is illustrated in FIG. 10. Whenever the differential input voltage changes (101), the current balance ratio in the first current balancing circuit changes accordingly (102). A transistor diode (N4-3) within the current path of said first current balancing circuit generates a voltage probe (103), representing the actual current in that path. A connection feeds said current probing voltage to the gate of a transistor (N8-3) within the current path of said second current balancing circuit, and which is placed in the same position as is transistor (N4) in said first current balancing circuit. Said current probing voltage brings said second current balancing circuit out of balance (104), which, as a direct consequence, said transistor (N8-3) forces the source of transistor (N6-3) to float and the gate of transistor (N6-3), which is directly connected to the same transistor's source floats with it, until said second current balancing circuit is in a now stable current ratio, which is now the same ratio as in said first current balancing circuit (105). Now the voltage difference between Vout and Vref is the same as the differential input voltage of Vin-p and Vin-n (106).

Figure 11:
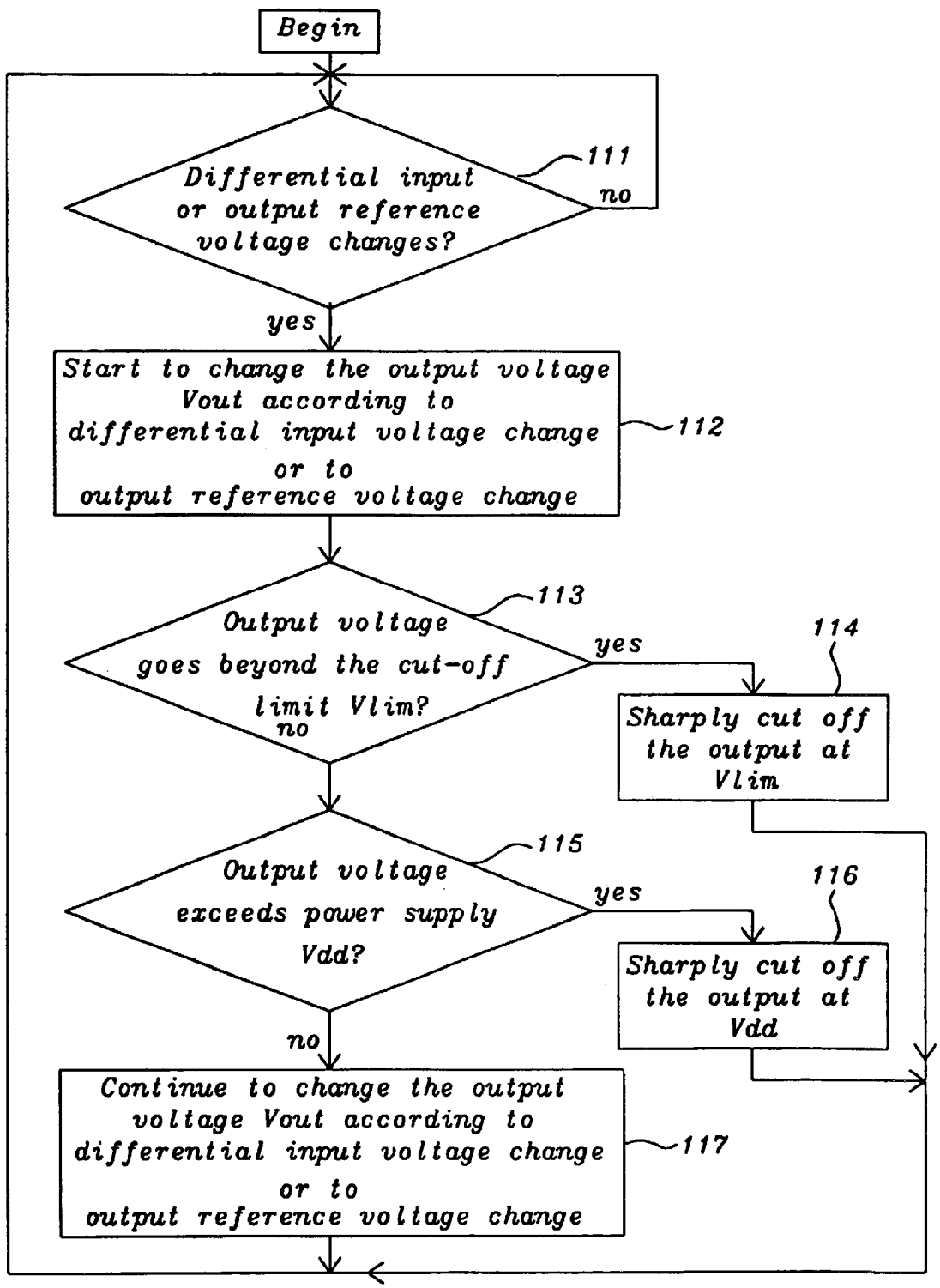
FIG. 11 briefly demonstrates the methods to sharply cut off the linear operating range.

The second method to achieve the objectives of this invention is illustrated in FIG. 11. Whenever the differential input voltage changes or when the reference voltage for the output is changed, i.e. adjusted to a new value, (111) the output voltage VOUT start to change according to said differential input voltage change or to said output reference voltage change (112). If said output voltage goes beyond the cut-off limit VLIM (113), Sharply cut off the output (114). If said output voltage exceeds power supply Vdd (115), sharply cut off the output (116). However, if the output stays within the linear operating region, continue to change the output voltage VOUT according to differential input voltage change or output reference voltage change (117).

While the invention has been particularly shown and described with reference to the preferred embodiments thereof, it will be understood by those skilled in the art that various changes in form and details may be made without departing from the spirit and scope of the invention.

What is claimed is:

1. A circuit implementing a translinear amplifier, disposed in a semiconductor substrate, intended to work linearly within a wide specified voltage range, with minimal component count, comprising:

a first means for a current dividing circuit with two branches, each comprising at least one MOSFET transistor and with a common current source, where the gates of said MOSFET transistors are connected with said translinear amplifier's inputs and where the current ratio in said branches of said first current dividing circuit is dependent on said translinear amplifier's input voltage difference;

a second means for a current dividing circuit with two branches, each comprising at least one MOSFET transistor and with a common current source, where one gate of said MOSFET transistors is connected with said translinear amplifier's reference voltage and the other is connected to said translinear amplifier's output and where the current ratio in said branches of said second current dividing circuit is dependent on the voltage difference of said translinear amplifiers reference voltage and output voltage; and means to force the current division within said first current dividing circuit and the current division within said second current dividing circuit to the same value of current ratios.

2. The circuit of claim 1 wherein said means to force the current division within said first and second current dividing circuits to the same current ratio is implemented as a closed feedback loop, mainly built by a current probing element within said first current dividing circuit and a current controlling element within said second current dividing circuit.

3. The circuit of claim 2 wherein said means to force the current division within said first and second current dividing circuits to the same current ratio is provided by a MOSFET transistor within the branch of said second current dividing circuit, where the gate of said MOSFET transistor is connected to a corresponding MOSFET transistor within the branch of said first current dividing circuit and where the gates of these two transistors are connected and where, in addition, the gate of said MOSFET transistor, which is connected to said translinear amplifier's output is also connected to that same transistor's drain.

4. The circuit of claim 3 wherein said MOSFET transistors, within said means for said current dividing circuit with two branches are made of PMOS transistors and where the transistors of said means to force the current division within said first and second current dividing circuit to the same value of current ratio are made of NMOS transistors.

5. The circuit of claim 3 wherein all components are complementary to claim 4, i.e. said MOSFET transistors, within said means for said current dividing circuit with two branches are made of NMOS transistors and where the transistors of said means to force the current division within said first and second current dividing circuit to the same value of current ratio are made of PMOS transistors.

6. A circuit implementing a translinear amplifier, intended to work linearly within a wide specified voltage range and to have sharp cutoff edges at the limits of said linear operating range, is achieved, comprising:

means for a translinear amplifier;

means to define the linear operating range means to sharply cut off said translinear amplifier's linear operation, once the defined linear operating range is exceeded at the negative end of said linear operating range; and means to sharply limit said translinear amplifier's linear operation, once the linear operating range is exceeded at the positive end of said linear operating range.

7. The circuit of claim 6 wherein said means to define the linear operating range compares the current of said current dividing circuits and, as long as the ratio does not exceed certain values, continues to operate linearly.

8. The circuit of claim 6 wherein said means to sharply cut off said translinear amplifier's linear operation, compares the current of said current dividing circuits and, if the ratio exceeds certain values, generate a signal to sharply raise said translinear amplifier's (negative) output voltage.

9. The circuit of claim 8 wherein said means to compare the currents is made by taking a current sample from one side of the current dividing circuit and, if the ratio exceeds a specified value, drawing more current from the translinear amplifier's output than that branch of said current dividing circuit can drive at this time, thus forcing the output to raise drastically.

10. The circuit of claim 7 wherein said means to define the linear operating range defines a specific current ratio as the linear range limits, for example a current ration of 1 to 8, could define the limit.

11. The circuit of claim 6 wherein said means to sharply limit said translinear amplifier's output voltage uses the limiting effect of the supply voltage effect as a purposely design element.

12. The circuit of claim 1 wherein said first and second current dividing circuit have the same current.

13. The circuit of claim 1 wherein said first and second current dividing circuit have different currents.

14. A circuit implementing a translinear amplifier, intended to save power whenever it operates outside the limits of an active operating range, is achieved, comprising:

means for a translinear amplifier;

means to define said active operating range of said translinear amplifier; and means to switch off most of the circuit elements to reduce the power consumption when the translinear amplifier itself is outside said active operating range.

15. The circuit of claim 14 wherein said means to define said active operating range verifies the inputs on both said branches on said first current dividing circuit to operate within their active working range.

16. The circuit of claim 14 wherein said means to define said active operating range mirrors a current probe on both sides of said first current balancing circuit and, as soon as either current falls below a certain limit, switches off most of the circuit elements to reduce the power consumption.

17. The circuit of claim 16 wherein sad means to switch off most of the circuit elements to reduce the power consumption when the translinear amplifier is outside said active operating range, switches off said second current balancing circuit.

18. The circuit of claim 17 wherein said means to switch off most of the circuit elements to reduce the power consumption when the translinear amplifier is outside said active operating range, has its switching element in series with the current source of said second current balancing circuit, to completely switching off said second current balancing circuit.

19. A circuit to compensate the temperature error of a P-MOS output stage which is attached to the translinear amplifier's output is achieved, comprising;

means for a translinear amplifier;

means of an output stage attached to said translinear amplifier, comprising a P-MOS input transistor at its input stage;

means for a reference element, comprising one or more P-MOS transistors, means for a constant current source; and means to connect the resulting reference voltage to said translinear amplifier's reference input.

20. A circuit of claim 19 wherein said means for a reference element compensates the temperature error of said means of an output stage attached to said translinear amplifier, comprising a P-MOS transistor at its input stage.

21. A circuit of claim 19 wherein each of said N-MOS type transistors within said means of an output stage attached to said translinear amplifier and within said means for a reference element, is replaced by their complementary P-MOS types.

22. A method to amplify signals with a translinear amplifier and intended to work linearly within a wide specified voltage range, with minimal component count, comprising a first means for a current dividing circuit with two branches, each comprising at least one MOSFET transistor and with a common current source, where the gates of said MOSFET transistors are connected with said translinear amplifier's inputs and where the current ratio in said branches of said first means for a current dividing circuit is dependent on said translinear amplifier's input voltage difference, comprising a second means for a current dividing circuit with two branches, each comprising at least one MOSFET transistor and with a common current source, where one gate of said MOSFET transistors is connected with said translinear amplifier's reference voltage and the other is connected to said translinear amplifier's output and where the current ratio in said branches of said second means for a current dividing circuit is dependent on the voltage difference of said translinear amplifier's reference voltage and output voltage and comprising means to force the current division within said first current dividing circuit and the current division within said second current dividing circuit to the same value of current ratio;

dividing the current between two branches of a first current dividing circuit depending on the differential voltage at said first current dividing circuit;

dividing the current between two branches of a second current dividing circuit, depending on the differential voltage at said second current dividing circuit;

forcing the current division within said first current dividing circuit and said second current dividing circuit to the same value of current ratios.

23. The method of claim 22 wherein forcing said current division within said first and said second current dividing circuit to the same value of rent ratios is primarily operating as a closed feedback loop.

24. The method of claim 22 wherein forcing said current division within said first and said second current dividing circuit to the same value of current ratios is performed by probing the current in one branch of said first current dividing circuit and feeding said voltage probe to a current controlling element in the same referenced branch of said second current dividing circuit and thus forcing to react until differential voltage between Vref and Vout at said second current dividing circuit is the same as the differential voltage between Vin-p and Vin-n at said first current dividing circuit.

25. The method of claim 23 wherein forcing said current division within said first and said second current dividing circuit to the same value of current ratios is provided by connecting the gates of a MOSFET transistor within the branch of said second current dividing circuit, where the gate of said MOSFET transistor is connected to said translinear amplifier's output and a corresponding MOSFET transistor within the branch of said first current dividing circuit; which forces the currents in these branches are the same, and, if the currents provided by the current sources of the two current dividing circuits are identical, the current ratios within each co said current dividing circuit must be the same.

26. A method for a translinear amplifier to work linearly within a wide specified voltage range and to have sharp cutoff edges at the limits of said linear operating range, is achieved, comprising:

providing means for a translinear amplifier, means to define the linear operating range, means to sharply raise said translinear amplifier's (negative) output voltage, outside the linear operating range, means to sharply limit said translinear amplifier's (positive) output voltage outside the linear operating range; and means to switch off most of the circuit elements to reduce the power consumption when the translinear amplifier itself is outside said linear operating range;

amplifying the translinear amplifier's input signal in a defined wide linear operating range;

sharply cutting off said translinear amplifiers linear operation, outside the linear operating range on one side; and sharply limiting said translinear amplifier's linear operation outside the linear operating range on the other side.

27. The method of claim 26, to sharply cut off said translinear amplifier's linear operation, compares the current of both branches of said current dividing circuits and, if the ratio exceeds certain values, generates a signal to sharply raise said translinear amplifier's (negative) output voltage.

28. The method of claim 26 uses the limiting effect of the supply voltage to sharply limit said translinear amplifier's output voltage as a purposely design function.

29. A method, intended to save power whenever a translinear amplifier operates outside the limits of an active operating range, is achieved, comprising:

providing means for a translinear amplifier, means to define said active operating range of said translinear amplifier; and means to switch off most of the circuit elements to reduce the power consumption when the translinear amplifier itself is outside said active operating range;

defining the active operating range of said translinear amplifier and switching off most of the circuit elements to reduce the power consumption when the translinear amplifier itself is outside said active operating range.

30. The method of claim 29 wherein defining said active operating range verifies the inputs on both said branches on said first current dividing circuit to still operate within their active working range.

31. The method of claim 29 wherein defining said active operating range mirrors a current probe on both sides of said first current balancing circuit and; as soon as either current falls below a certain limit, switches off most of the circuit elements to reduce the power consumption.

32. The method of claim 29 wherein switching off most of the circuit elements to reduce the power consumption when the translinear amplifier is outside said active operating range, switches off said second current balancing circuit.

33. A method to compensate the temperature error of a P-MOS output stage which is attached to the translinear amplifier's output is achieved, comprising:

providing means for a translinear amplifier, means of an output stage attached to said translinear amplifier, comprising a P-MOS input transistor at its input stage, means for a reference element, comprising one or more P-MOS transistors, means for a constant current source and means to connect the resulting reference voltage to said translinear amplifier's reference input;

compensating the temperature error inherent to said attached P-MOS input transistor with the same temperature characteristics inherent to said reference element's P-MOS transistor.

* * * * *